United States Patent [19]

Knowles et al.

[11] Patent Number: 5,560,779
[45] Date of Patent: Oct. 1, 1996

[54] APPARATUS FOR SYNTHESIZING DIAMOND FILMS UTILIZING AN ARC PLASMA

[75] Inventors: Steven C. Knowles; Alan E. Kull; George W. Butler, all of Seattle; David O. King, Woodinville, all of Wash.

[73] Assignee: Olin Corporation, Redmond, Wash.

[21] Appl. No.: 90,842

[22] Filed: Jul. 12, 1993

[51] Int. Cl.$^6$ .............................. C23C 16/26; C23C 16/50
[52] U.S. Cl. .................... 118/723 MP; 118/715; 118/723 DC; 118/723 E; 118/723 R; 423/446; 204/298.41; 219/121.5; 219/121.51; 219/121.52
[58] Field of Search .............................. 118/715, 723 DC, 118/723 MP, 723 HC, 723 E, 723 ER, 723 R, 725, 729; 423/446; 204/298.41; 219/121.5, 121.51, 121.52

[56] References Cited

U.S. PATENT DOCUMENTS

| 4,645,977 | 2/1987 | Kurokawa et al. | |
|---|---|---|---|
| 4,767,608 | 8/1988 | Matsumoto et al. | |
| 4,830,702 | 5/1989 | Singh et al. | |
| 4,851,254 | 7/1989 | Yamamoto et al. | |
| 5,010,842 | 4/1991 | Oda et al. | 118/715 |
| 5,070,274 | 12/1991 | Yoshikawa et al. | |
| 5,102,523 | 4/1992 | Beisswenger et al. | 118/723 E |
| 5,104,634 | 4/1992 | Calcote | |
| 5,169,452 | 12/1992 | Nakayama et al. | |
| 5,201,986 | 4/1993 | Ota et al. | |
| 5,203,924 | 4/1993 | Mitani et al. | 118/723 E |
| 5,204,144 | 4/1993 | Cann et al. | 427/569 |
| 5,204,145 | 4/1993 | Gasworth | 118/723 |
| 5,243,169 | 9/1993 | Tateno et al. | 219/121.51 |
| 5,318,801 | 6/1994 | Snail et al. | 423/446 |

FOREIGN PATENT DOCUMENTS

| 302836.7 | 10/1988 | European Pat. Off. |
| 0286306 | 10/1988 | European Pat. Off. |

OTHER PUBLICATIONS

H. Vora and T. J. Moravec "Structural Investigation of Thin Films of Thin Films of Diamondlike Carbon" appearing in Journal Of Applied Physics vol. 52, No. 10 (Oct. 1981) at pp. 6151–6157.

*Primary Examiner*—R. Bruce Breneman
*Assistant Examiner*—Rodney G. McDonald
*Attorney, Agent, or Firm*—Gregory S. Rosenblatt

[57] ABSTRACT

There is provided a system for the manufacture of a diamond film. A plasma generator generates a hydrogen atom containing plasma stream into which a hydrocarbon containing gas is fed. The plasma dissociates the hydrocarbon to carbon radicals and carbon which are deposited on a substrate where the carbon crystallizes to a diamond film. The efficiency of the system is increased by heating the hydrogen source gas prior to generation of the plasma. Other means to increase the effectiveness of the system include using a plurality of plasma streams and shaping the plasma stream. A low internal strain, high quality optical film is generated by depositing the carbon on a substrate supported by a heat sink having nonuniform thermal conductivity such that the thermal gradient across the surface of the heat sink is less than about 8° C./centimeter.

24 Claims, 8 Drawing Sheets

APPARATUS FOR SYNTHESIZING DIAMOND FILMS UTILIZING AN ARC PLASMA

BACKGROUND OF THE INVENTION

The present invention relates to an apparatus for the synthesis of a diamond film utilizing an arc plasma. More particularly, the efficiency of a diamond synthesis apparatus is improved by modification of the plasma generator nozzle, shaping the plasma and thermal management of a substrate receiving the diamond film.

Synthetic diamond films are manufactured by many different processes. In one exemplary process, a carbon containing feed gas, such as methane, is decomposed to elemental carbon by injection into a plasma stream. This process is described in more detail in U.S. Pat. No. 4,767,608 to Matsumoto et al and European Patent Application Serial No. 88 302836.7 to Fujitsu Ltd., both of which are incorporated by reference herein in their entireties.

In accordance with this method, a hydrogen containing plasma source gas flows between an anode and a cathode where an electric arc generates a plasma. A hydrocarbon containing source gas is introduced into the plasma and is dissociated to carbon radicals, carbon and hydrogen. The carbon containing plasma impacts a substrate depositing the carbon radicals and carbon. Under the proper conditions, the deposition is crystalline carbon, generating a diamond film.

Among the disadvantages with the conventional process are the limited diameter of the plasma plume and the temperature gradient across the plasma plume both of which restrict the size and thickness of the deposited diamond film. The perimeter of the plasma plume cools more rapidly than the central portion. The cooler peripheral portion of the plasma plume is less effective for dissociation of the hydrocarbon containing source gas, resulting in a lower growth rate of diamond film. Additionally, the thermal gradient in the substrate causes internal strain in the deposited diamond film which can crack the film or affect the optical properties.

There exists, therefore, a need in the art for an improved apparatus for the synthesis of a diamond film utilizing arc plasma which does not suffer the limitations of the prior art.

SUMMARY OF THE INVENTION

Accordingly, it is an object of the invention to provide an improved apparatus for the synthesis of a diamond film utilizing an arc plasma. It is a feature of the invention that the plasma generator may contain one or more passageways so that either the plasma source gas or the hydrocarbon feed gas is preheated by contact with the anode. Yet another feature of the invention is that the plasma generator may contain multiple plasma jets for improved mixing of the hydrocarbon feed gas in the plasma. Still another feature of the invention is that the plasma stream may be shaped either mechanically or electromagnetically to limit plasma cooling and to change the velocity of the plasma stream. Still another feature of the invention is that the synthesized diamond film is formed uniformly over the entire substrate by depositing the carbon species on a moving substrate or by subjecting the deposited carbon species to variable cooling rates.

It is an advantage of the apparatus of the invention that an inert carrier gas is not required. Another advantage is by using the apparatus of the invention, a uniform, strain free diamond film is formed. Yet another advantage is that the diamond film may be larger than the diameter of the plasma plume. Still another advantage is that efficiency increases in diamond deposition provided by the invention lead to a higher diamond film growth rate.

In accordance with the invention, there is provided a system for the deposition of a diamond film. The system includes a plasma source gas and a plasma generator. The plasma generator contains a centrally positioned cathode with an anode disposed about the cathode. The plasma generator converts the plasma source gas to a plasma stream. A feed tube introduces a carbon feed gas into the plasma stream. A substrate disposed within the plasma stream then receives the deposited diamond film.

In one embodiment of the invention, the anode contains at least one passageway for receiving either the plasma source gas or the carbon feed gas. In a second embodiment, a plate abuts the downstream side of the anode, diverging the plasma stream into a plurality of plasma streams. In a third embodiment, the anode contains a plurality of apertures each containing a separate cathode to generate a plurality of plasma streams. In a fourth embodiment, a containment structure shapes the plasma stream. In a fifth embodiment, a heat sink removes heat from the substrate so that the thermal gradient across the surface of the substrate is less than about 8° C. per centimeter.

The above stated objects, features and advantages will become more apparent from the specification and drawings which follow.

DETAILED DESCRIPTION OF THE INVENTION

Figure 1:
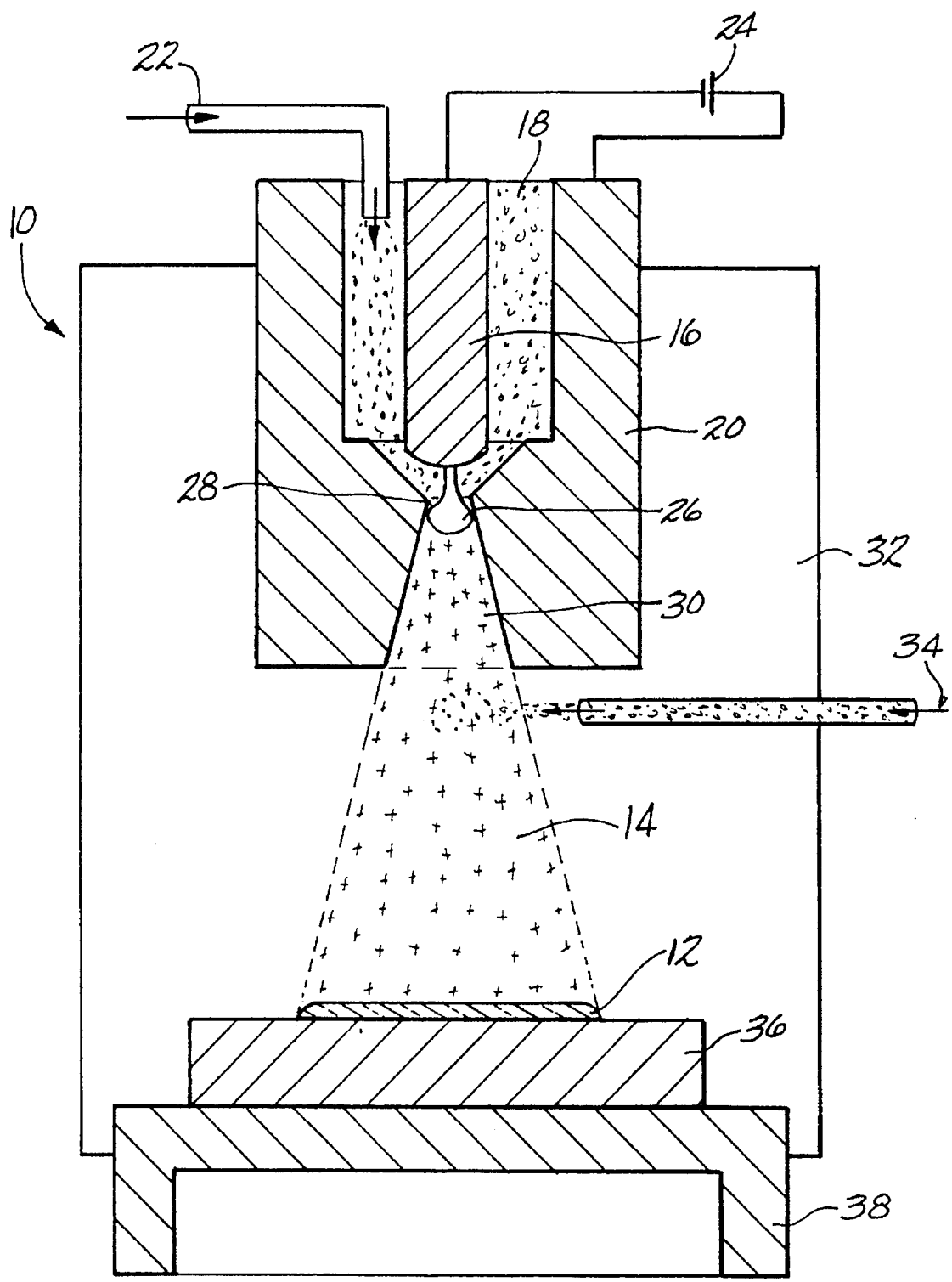
FIG. 1 shows in cross-sectional representation a diamond deposition system utilizing an arc plasma as known from the prior art.

FIG. 1 shows in cross-sectional representation an apparatus 10 for the deposition of a diamond film 12 utilizing an arc plasma 14 as known from the prior art. The diamond deposition apparatus 10 includes a cathode 16 centrally positioned in an aperture 18 formed in an anode 20. A hydrogen source gas 22, such as methane, is introduced through the aperture 18. The hydrogen source gas is mixed with a carrier gas, typically an inert gas such as argon, to achieve stable operation of the arc plasma source. The carrier gas does not contribute to carbon dissociation process and is an additional material cost. Elimination of the carrier gas, in accordance with embodiments of the invention, results in a more effective diamond deposition system.

The cathode 16 is typically tungsten or a similar high melting temperature material. To promote cooling, the anode 20 is copper or a copper alloy. One function of the carrier gas is to maintain the temperature of the arc plasma 14 sufficiently low that excessive erosion of the anode 20 does not occur.

A power supply 24 applies a voltage differential between the cathode 16 and the anode 20. When the voltage differential is in the range of from a few hundred to a few thousand volts, an electric arc 26 bridges the gap between the cathode 16 and the anode 20 ionizing the hydrogen source gas 22 forming an arc plasma 14. The aperture 18 is generally at atmospheric pressure. The electric arc 26 is formed at a constricted throat 28 of the anode 20 and extends into a nozzle 30. A portion of the apparatus 10 downstream of the constricted throat 28 is under a vacuum 32 at a pressure of less than about 50 torr and more preferably, at a pressure of from about 0.1 to about 10 torr, and most preferably, in the range of from about 1 to about 5 torr. As the arc plasma 14 passes through the nozzle 30, it accelerates to supersonic speeds. Typically, the plasma temperature is in excess of 3000° C.

A hydrocarbon feed gas 34 is injected into the plasma stream 14 and dissociated into carbon radicals, carbon and hydrogen. The carbon and carbon radicals are deposited on a substrate 36 which is typically molybdenum, silicon or other high melting temperature material. Under proper cooling conditions, the carbon is deposited as a crystalline carbon, diamond, film 12. To assist in thermal management, a heat sink 38, typically a copper block, supports the substrate 36.

Figure 2:
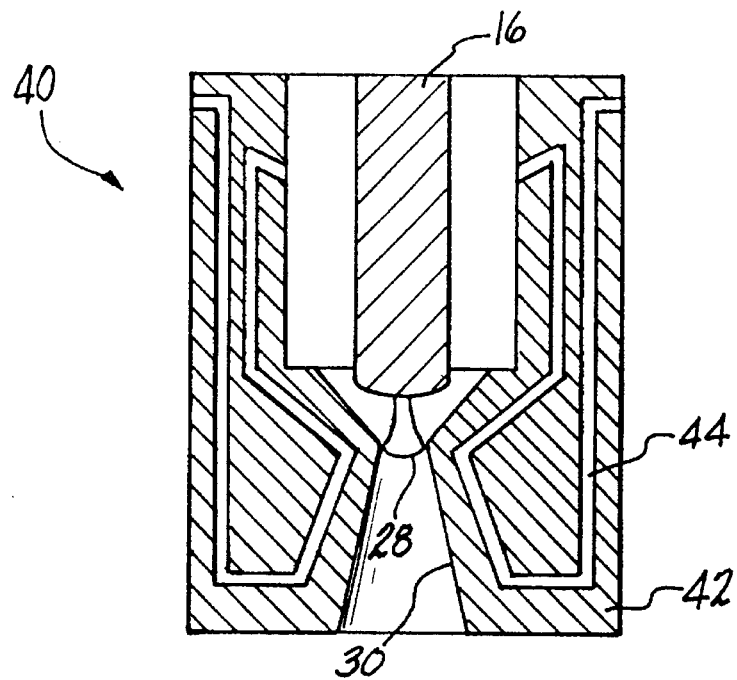
FIG. 2 shows in cross-sectional representation a plasma generator in which the anode contains a passageway for introducing a gas.

In the prior art, the hydrogen source gas 32 is mixed with an inert gas to maintain a stable arc. By proper selection of anode and cathode materials and geometries, the inventors have achieved stable operation with pure hydrogen. In addition, by using the plasma generator 40 illustrated in cross-sectional representation in FIG. 2, higher thermal efficiency of the arc device is obtained with both a pure hydrogen and a mixed source gas.

The plasma generator 40 contains a cathode 16 and an anode 42 containing a passageway 44. Either the hydrogen source gas or the hydrocarbon feed gas or both may be introduced to the plasma generator 40 through passageway 44. It is desirable for the passageway 44 to pass in close proximity to the nozzle 30 and constricted throat 28. The gas passing through the passageway 44 both cools down the anode 42 and, concurrently, becomes hotter and more energetic. Preheating either the hydrogen source gas or the hydrocarbon feed gas improves the efficiency of the diamond deposition system.

The velocity of the arc plasma is dependent on the molecular weight of the plasma constituents. Removal of the larger molecular weight, slower, carrier gas component, increases the velocity of the arc plasma increasing the efficiency of the hydrogen atoms in dissociating the hydrocarbon feed gas. Further, eliminating the carrier gas increases the density of hydrogen atoms at the interface of the arc plasma and the deposited diamond film where the hydrogen atoms remove non-diamond forms of carbon from the substrate. The higher the concentration of hydrogen atoms at the interface, the more efficient the conversion to diamond film.

Any suitable electrically conductive material may be used for both the cathode 16 and anode 42, Applicants have determined that thoriated (2% by weight thorium) tungsten is one preferred material for the cathode 16. The anode 42 is tungsten or another suitable material. With this composition, the plasma generator 40 has successfully been operated utilizing pure hydrogen as the source gas for in excess of 800 hours.

Figure 3:
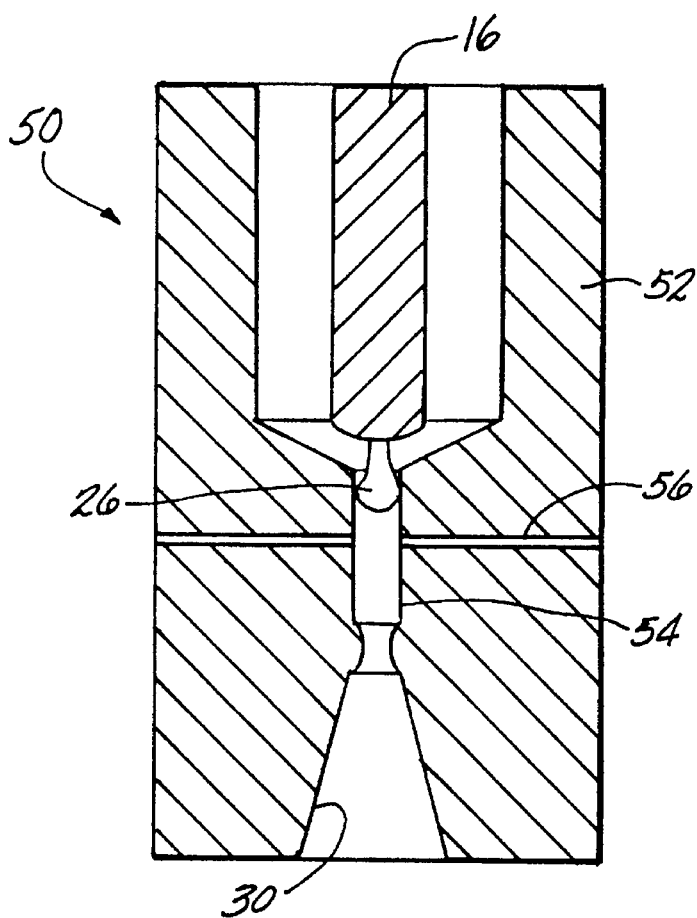
FIG. 3 shows a plasma generator in which the feed gas is introduced to a subsonic plasma stream.

FIG. 3 shows in cross-sectional representation a second plasma generator 50. A cathode 16 is disposed within an anode 52. Rather than the spark 26 attaching to the constricted throat and nozzle, where the arc plasma accelerates to supersonic speed, in this embodiment, the electric arc 26 attaches to a constricted region 54. Within the constricted region 54, the arc plasma travels at subsonic speed and does not achieve supersonic speed until entering the nozzle 30. The advantage of this embodiment is that the sharply peaked temperature profile generated by prior art apparatus is reduced by the mixing effect when the arc plasma passes through the nozzle 30.

The hydrocarbon feed gas may be introduced downstream of the anode as illustrated in FIG. 1 or introduced through passageway 56 into the subsonic constricted region 54. Better mixing of the feed gas in the arc plasma is achieved by longer exposure of the gases to the electric arc in the subsonic region. A regenerative gas passageway (44 in FIG. 2) is, optionally, incorporated into the plasma generator 50 of FIG. 3.

Figure 4:
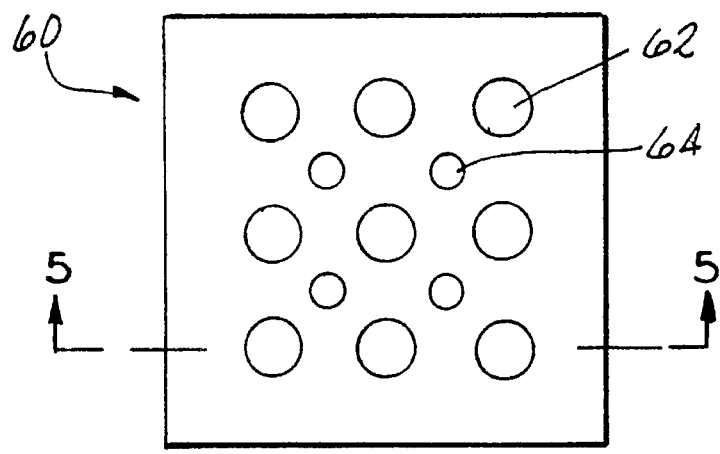
FIG. 4 shows in bottom planar view, a plate to generate a plurality of plasma streams.

Improved mixing of the hydrocarbon feed gas into the arc plasma is achieved with the spray nozzle block 60 shown in bottom planar view in FIG. 4. The spray nozzle block 60 is formed from any material which is capable of withstanding the temperature of the arc plasma, about 3000° C. Preferably, the spray nozzle block 60 is formed from molybdenum, tungsten or other suitable refractory metal. The spray nozzle block 60 contains a plurality of first apertures 62 and second apertures 64. The first apertures 62 diverge an arc plasma generated by any suitable plasma generator. The second apertures 64 provide the feed gas. Preferably, the first apertures 62 are larger in diameter than the second apertures 64 because the volume of hydrogen in the arc plasma is greater than the volume of dissociated feed gas. The average diameters of the first apertures 62 and second apertures 64 are relatively small to achieve rapid uniform mixing. In accordance with gas flow dynamics, the arc plasma and hydrocarbon feed gas will be well mixed within a distance equivalent to 100 times the distance between adjacent first apertures. The substrate is positioned from about 10 to about 200 times the distance between adjacent first apertures. Preferably, the substrate is positioned at a distance of from about 20 to about 100 times the distance between adjacent first apertures.

The size of the first apertures is from about 1 millimeter to about 20 millimeters and preferably from about 2 millimeters to about 5 millimeters. The second apertures are from about 0.1 millimeter to about 1 millimeter and preferably from about 0.2 millimeter to about 0.5 millimeter.

If the distance between the spray nozzle block 60 and the substrate is too large, the hydrogen atoms in the plasma stream recombine to $H_2$ which is ineffective in reducing carbon radicals and carbon ions to elemental carbon.

Figure 5:
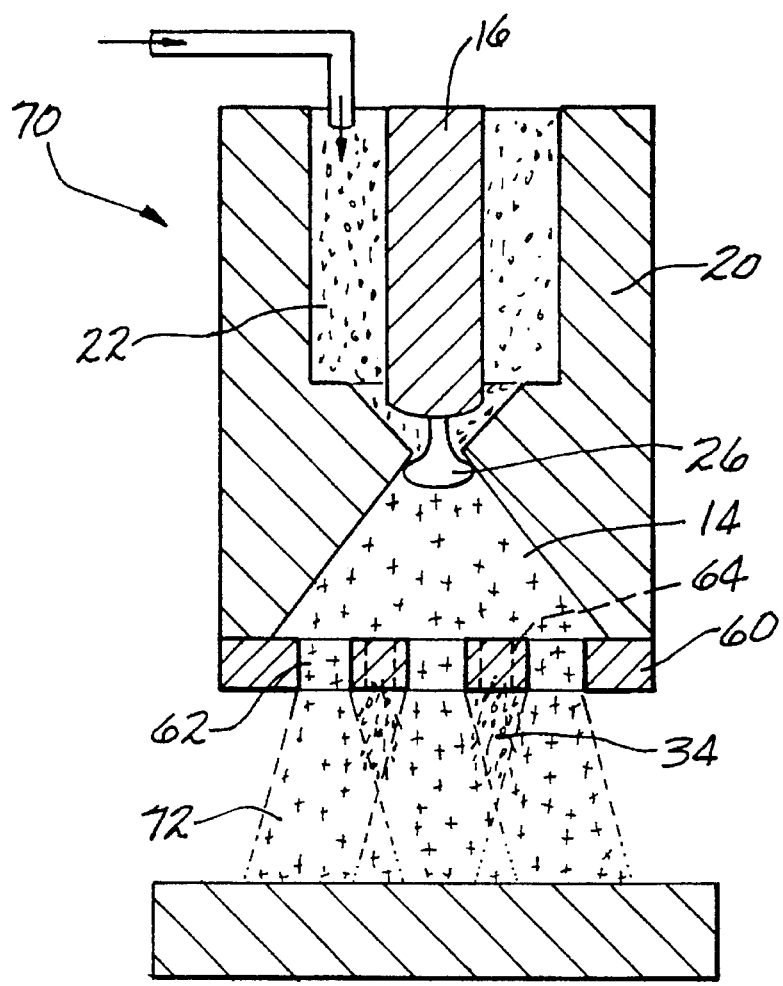
FIG. 5 shows in cross-sectional representation the plate of FIG. 4 in combination with an arc plasma generator.

The diamond deposition apparatus 70 illustrated in cross-sectional representation in FIG. 5 illustrates an application of the spray nozzle block 60. A hydrogen source gas 22 flows between a cathode 16 and an anode 20. In the presence of a suitable voltage potential, an electric arc 26 is generated, creating an arc plasma 14. The arc plasma 14 is diverged by the spray nozzle block 60 into a plurality of second plasma streams 72. The second plasma streams 72 overlap with complete mixing occurring at a distance of about 100 times the average distance between adjacent first apertures 62. A hydrocarbon feed gas is dispersed into the second plasma streams 72 through second apertures 64. Dispensing the hydrocarbon feed gas 34 through a plurality of second apertures 64 directly into the second plasma stream 72 provides superior mixing of the hydrocarbon feed gas into the arc plasma and an improved diamond film.

Figure 6:
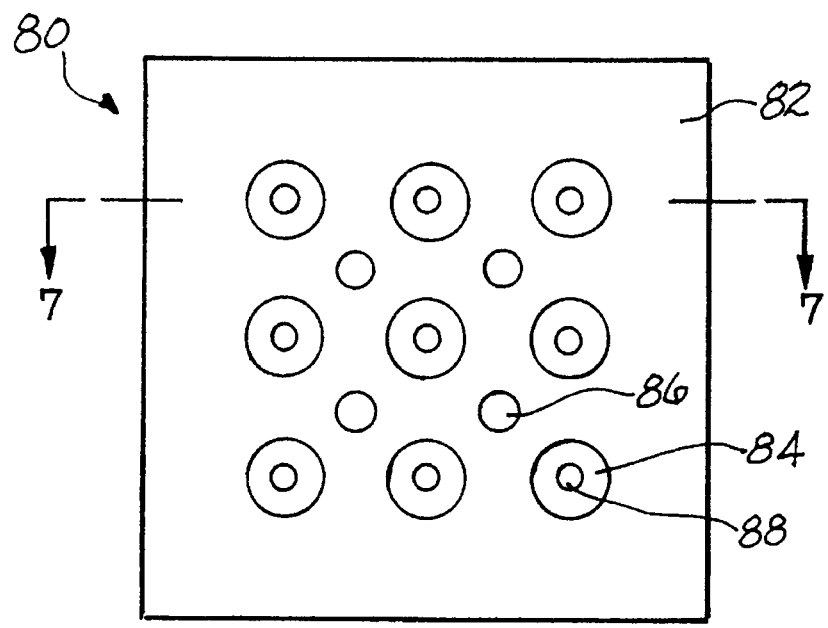
FIG. 6 shows in bottom planar view an anode for the generation of a plurality of plasma streams.

The spray nozzle block may be incorporated into the plasma generator as illustrated in bottom planar view in FIG. 6. The plasma generator 80 has an anode 82 with a plurality of first apertures 84 and second apertures 86. Disposed within the first apertures 84 are cathodes 88. When a voltage potential is applied between the anode 82 and the cathodes 88, the resultant electric arc generates an arc plasma in a hydrogen source gas flowing through the first apertures 84. The second apertures 86 provides the hydrocarbon feed gas.

Figure 7:
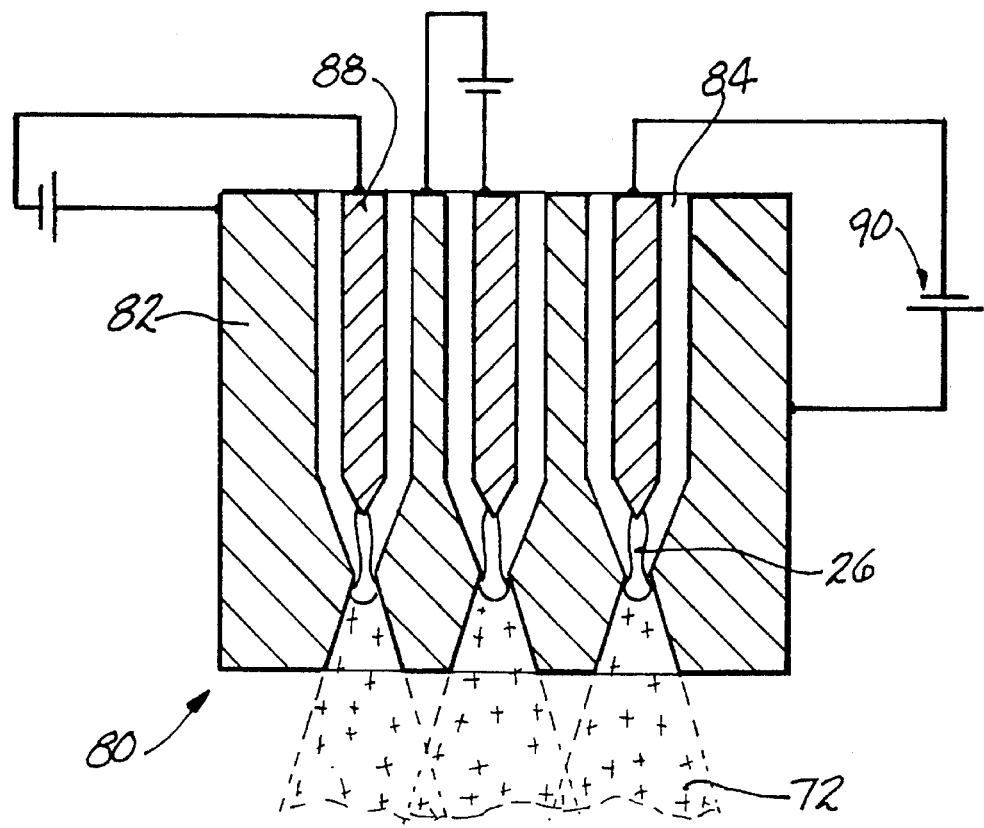
FIG. 7 shows in cross-sectional representation the anode of FIG. 6 in combination with a plurality of cathodes.

The plasma generator 80 is shown in cross-sectional representation in FIG. 7. A plurality of cathodes 88 are disposed in the first apertures 84. When the power supply 90 generates a voltage potential between the anode 82 and cathodes 88, an electric arc 26 is generated. Separate power supplies are utilized to generate each electric arc. Alternatively, a single power supply in combination with a variable resistor connected to each cathode may be used to provide the proper voltage differential. The electric arc generates a plurality of second plasma streams 72. As described above, the plasma generator 80 combined with a plurality of second apertures to introduce the hydrocarbon feed gas provides superior mixing of the feed gas in the hydrogen containing plasma.

Figure 8:
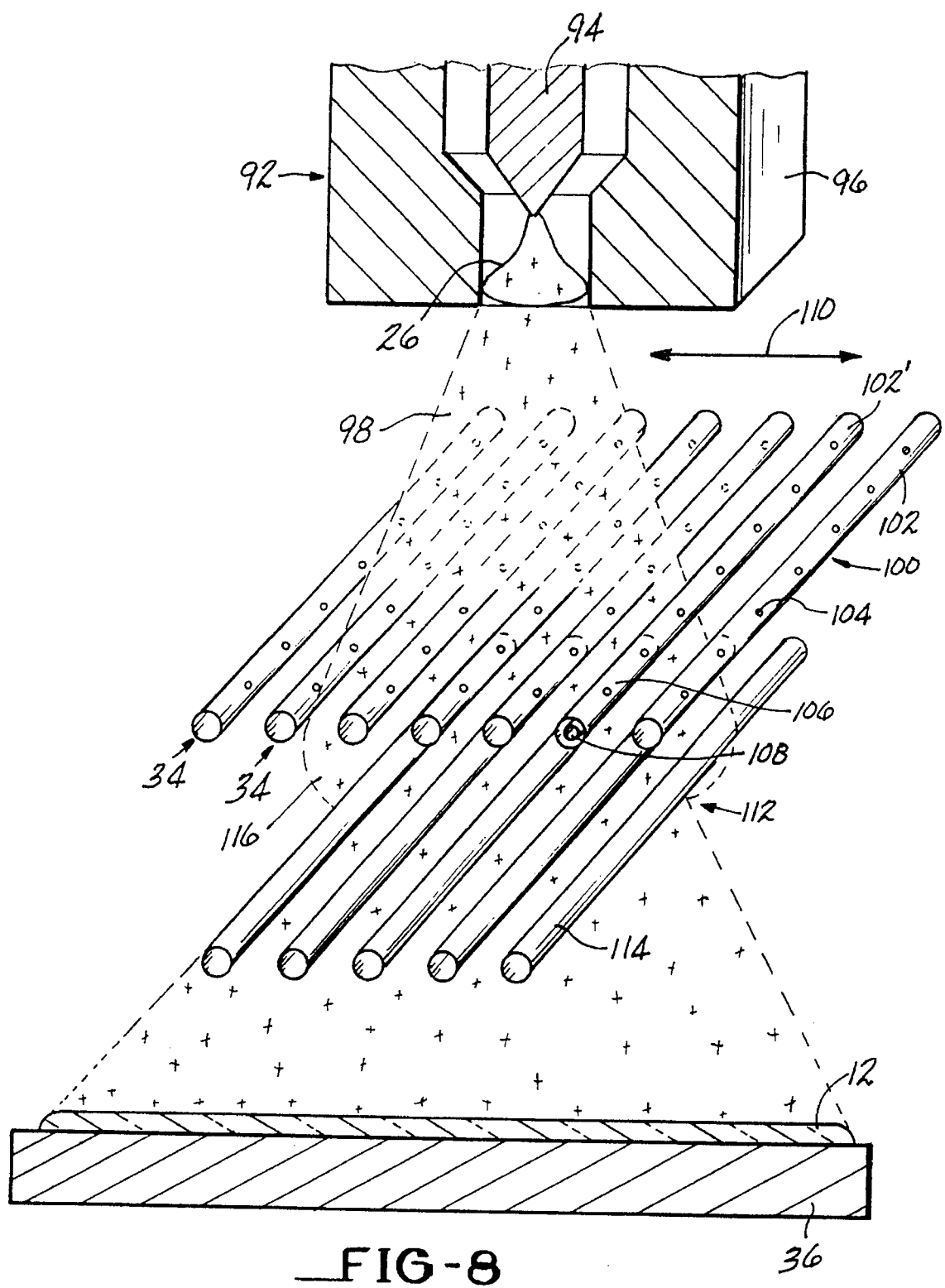
FIG. 8 shows in cross-sectional representation an apparatus for turbulently introducing a carbon feed gas into a plasma stream and a means to electrically contain the plasma stream.

FIG. 8 is a perspective view of a system 90 for the deposition of a diamond film. In the system 90, the plasma generator 92 includes a cathode 94 and an anode 96 of any suitable configuration. A hydrogen source gas flowing between the cathode 94 and the anode 96 is ionized by an electric arc 26 to form a diverging plasma stream 98. Interposed into the diverging plasma stream 98 is an injector grid 100. The injector grid 100 has a plurality of spray bars 102 which are preferably parallel and equally spaced. The spray bars 102 are hollow and the hydrocarbon feed gas 34 flows through the injector tubes 102. A plurality of apertures 104 disperse the hydrocarbon feed gas 34 into the diverging plasma stream 98. The apertures 104 provide improved mixing of the hydrocarbon feed gas 34 into the diverging plasma stream 98.

In a preferred embodiment, the injector bars 102' are double wall tubes in which the hydrocarbon feed gas flows in the exterior portion 106 and a coolant such as water flows through the central portion 108.

In a second preferred embodiment, the injector grid 100 is subject to displacement as indicated by reference arrow 110. Displacement may be horizontal, vertical or a combination thereof. The displacement improves the mixing of the hydrocarbon feed gas into the plasma stream by introducing turbulence to the diverging plasma stream.

In each of the above described embodiments, the injector grid 100 may be formed from any suitable material such as copper, tungsten, molybdenum or alloys thereof.

Each of the above plasma generators forms a diverging plasma stream 98. The periphery of the plasma stream cools more readily than the central portion of the stream. As a result, the efficiency of diamond deposition is reduced around the periphery of the stream and an inferior film is deposited. Shaping the plasma stream can improve mixing of the relatively hot central portion with the cooler peripheral part, resulting in a more uniform deposition. One suitable method is with an anode grid 112. The anode grid 112 is any suitable electrically conductive material such as molybdenum, tungsten or other suitable refractory metal. The anode grid 112 is preferably a plurality of parallel anode bars 114 disposed in the diverging plasma stream 98. The anode bars 114 are at approximately the same voltage potential as the anode 96. The electrically attractive force of the positively charged anode bars causes the plasma stream to attach to the anode bars and broaden forming a diverging plasma stream 116. The diverging plasma stream provides for a more uniform temperature throughout the plasma by broadening the hot gas central region of the plasma plume. The diverging plasma stream 116 is then deposited on substrate 36 to synthesize a diamond film 12.

Figure 9:
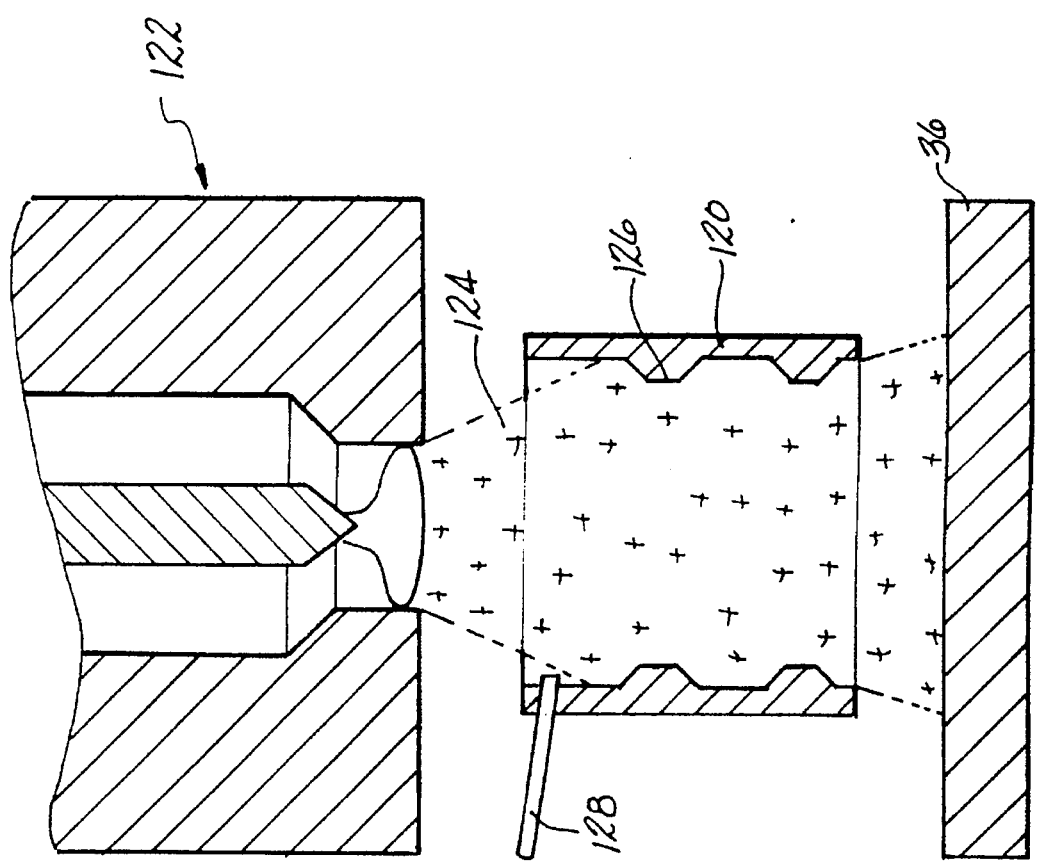
FIG. 9 shows in cross-sectional representation an apparatus for the physical containment of a plasma stream.

Conventional diamond deposition systems expand the plasma stream in an evacuated chamber. This method entrains cooler gas into the periphery of the plasma plume, lowering the temperature and reducing the effectiveness of the plasma. FIG. 9 illustrates in cross-sectional representation a mechanical containment structure 120 to reduce gas entrainment. The mechanical containment structure 120, in a first embodiment, is a uniform diameter tube disposed between the plasma generator 122 and substrate 36. The mechanical containment structure 120 prevents the periphery of the plasma plume 124 from mixing with the surrounding environment and cooling. The containment structure 120 may be heated, cooled or thermally isolated to achieve a plasma 124 of a desired temperature. Preferably, the containment structure 120 is a thermally isolated structure which is heated by the plasma.

To promote mixing of the hydrocarbon feed gas with the plasma stream, the mechanical containment structure 120 may include turbulence inducing structures 126 such as ridges, spirals or other surface irregularities. The mechanical containment structure may be subject to displacement either in a horizontal or vertical plane, rotational displacement, or a combination thereof. Injection of the hydrocarbon feed gas may be upstream, downstream or within the mechanical containment structure 120 such as by orifice 128.

Figure 10:
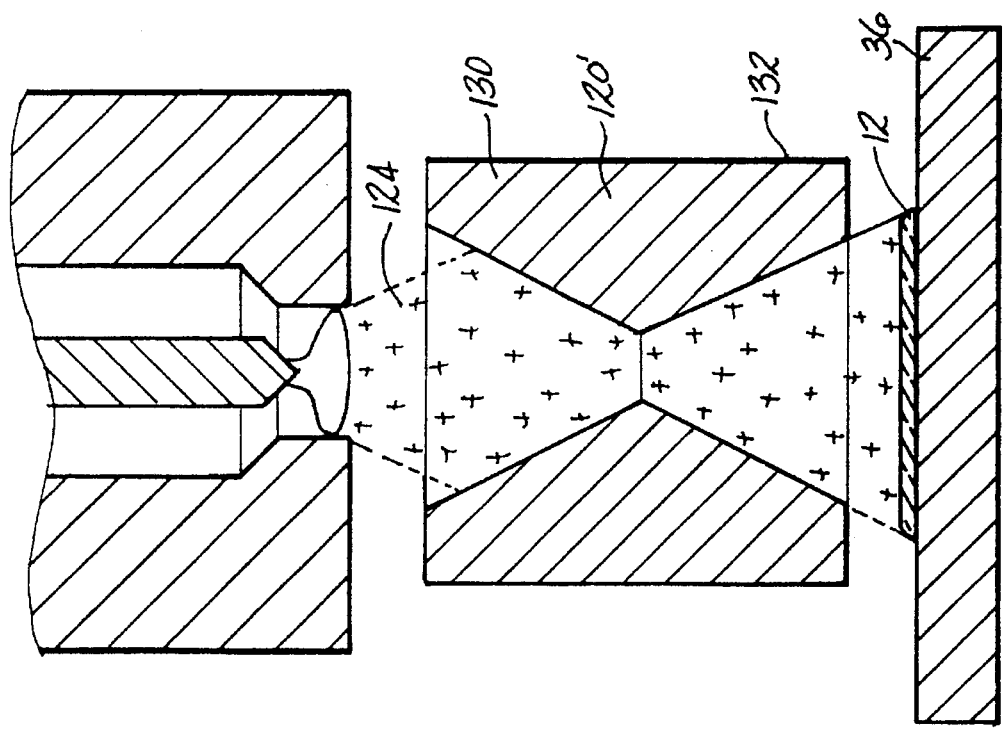
FIG. 10 shows in cross-sectional representation an apparatus for the physical containment of a plasma stream which generates shock waves within the plasma stream.

As illustrated in cross-sectional representation in FIG. 10, the mechanical containment structure 120' may be a converging cone 130 or a diverging cone 132 or a combination of such cones. In the combination of cones, the plasma 124 is decelerated to subsonic speed in the converging cone 130 and then broadened in the diverging cone 132. The shock generated when the plasma is decelerated from supersonic speed allows better mixing of the hydrocarbon feed gas in the plasma.

The mechanical containment structure 120' is any desired shape for containing the plasma 124. The mechanical containment structure is manufactured from any suitable high temperature material such as molybdenum, tungsten or a ceramic such as alumina or zirconia. The containment structure may be electrically isolated or at the same voltage potential as the anode, or at any other positive voltage.

The diamond film 12 is improved by management of the substrate 36. The substrate 36 can be subject to translational motion to increase the surface area which can be covered. This translational motion may be horizontal, vertical, rotational or a combination thereof. Additionally, the substrate 36 may be vibrated at a rate effective to reduce the boundary layer at the interface of the plasma 124 and diamond film 12. Alternatively, the plasma generator may be rastered in any desired pattern to increase the diamond film coverage.

Figure 11:
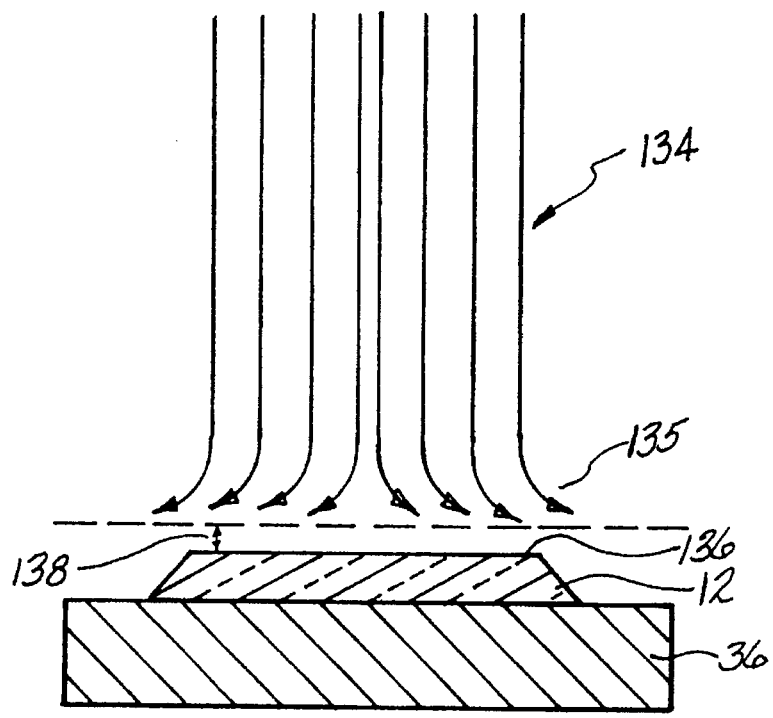
FIG. 11 graphically illustrates the flow of a plasma stream at the interface with a substrate.

FIG. 11 graphically illustrates the flow pattern of a plasma plume 134. The plasma plume approaches the developing film 12 and is deflected. The deflected plasma plume 135 flows parallel to the top surface 136 of the diamond film 12. A boundary layer identified by reference arrow 138, typically on the order of from about 1 to about 10 millimeters thick, develops between the top surface 136 of the diamond film 12 and the plasma plume 134. Growth of the diamond film 12 is dependent on diffusion of the carbon containing species across the boundary layer 138. The thickness of the boundary layer can be reduced by vibrating the substrate 36 at the appropriate frequency to induce local turbulent disturbances. This frequency of oscillation is determined by solving the Tollmien-Schlichting wave effect formula:

$$(U - C)(\phi'' - \alpha^2\phi) - U'' = -i/\alpha R (\phi'''' - 2\alpha^2\phi'' + \alpha^4\phi)$$

U=mean flow velocity

R=suitable Reynolds number

α=real wave number of the oscillation

φ(y)=amplitude of the wave

C=(Br+iBi)/α where Br is the angular frequency of oscillation and Bi is the amplification factor. When Bi is greater than 0, instability in the form of turbulence, is introduced.

This differential equation results from solving the two dimensional Navier-Stokes equations using the stream function:

$$\psi(x,y,t) = \phi(y) e^{i(\alpha x - (Br+iBi)t)}$$

For the diamond deposition systems of the invention, the vibration frequency $B_r$ is less than about 100 kHz.

Figure 12:
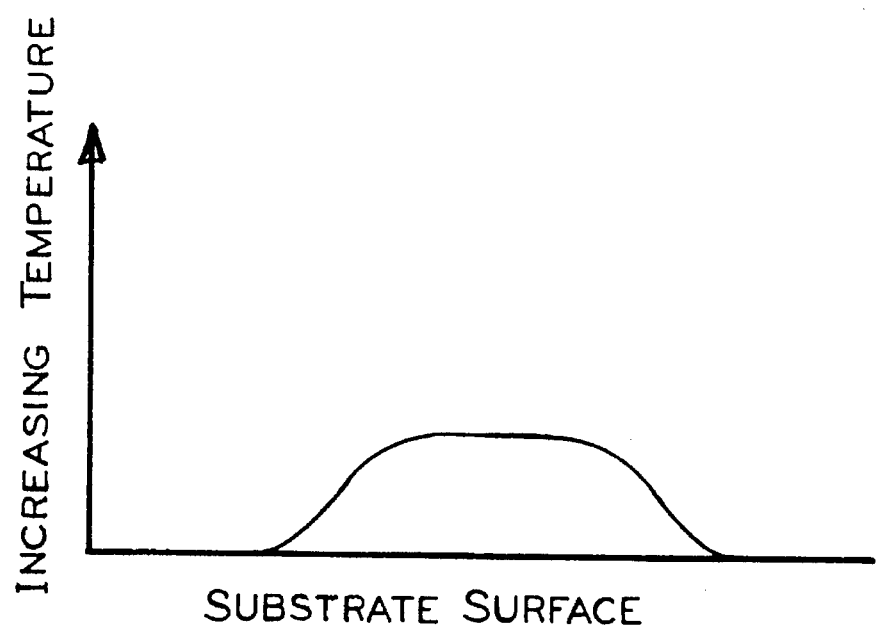
FIG. 12 graphically illustrates the thermal gradient which develops within a deposited diamond film.

The laminar flow pattern causes a temperature gradient to develop across the substrate 36. FIG. 12 illustrates graphically this temperature gradient. The substrate is hotter at the center than at the periphery. The temperature gradient is undesirable since it introduces strain into the developing diamond film. This strain can cause fracture of the film or inconsistent optical properties. By designing the substrate with a controlled, nonuniform cooling rate, the thermal gradient is reduced.

Figure 13:
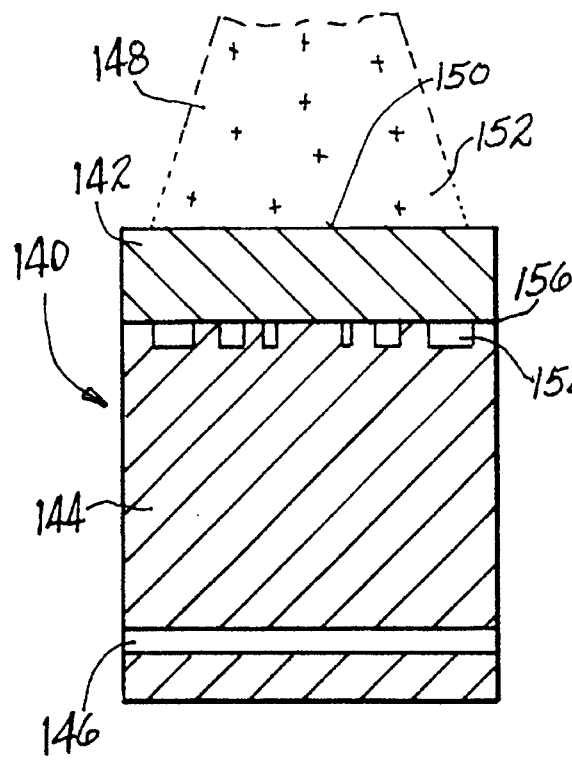
FIGS. 13–15 show in cross-sectional representation heat sink configurations to reduce the thermal gradient across a substrate.

FIG. 13 illustrates in cross-sectional representation a substrate holder 140. The substrate holder 140 has a top plate 142 formed from a thermally conductive, high melting temperature material. Suitable top plates 142 include molybdenum, titanium, silicon and alloys thereof. A metallic heat sink 144, typically formed from copper or a copper alloy, removes heat from the top plate 142. Optionally, to increase effectiveness, the heat sink 144 may be water cooled, including passageways 146 to circulate water or another cooling fluid. Due to the flow pattern of the plasma plume 148, the temperature of the top plate 142 is higher in the center 150 than the periphery 152. One way to minimize the thermal gradient is through thermally resistive gaps 154. By increasing the number and/or size of the thermally resistive gaps at the interface 156 of the top plate 142 and heat sink 144, reduced heat flow occurs at the periphery 152, reducing the thermal gradient across the top plate 142. The thermally resistive gaps 154 may be open channels or filled with a thermally nonconductive material such as alumina.

Preferably, the thermal gradient across the top plate 142 is less than about 8° C./centimeter and more preferably, less than about 4° C./centimeter.

Figure 14:
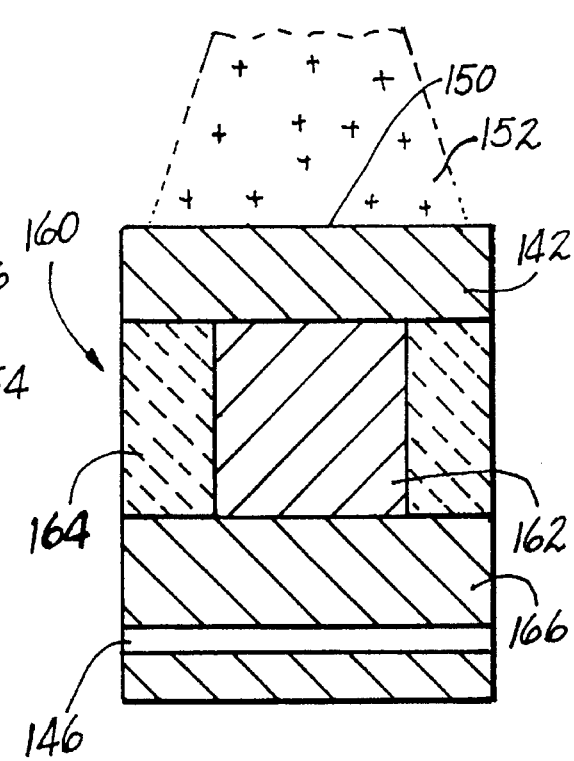

FIG. 14 illustrates in cross-sectional representation a composite substrate holder 160 for minimizing the thermal gradient across the top plate 142. The center 150 is in contact with a high thermal conductivity core 162 such as copper or a copper alloy. The periphery 152 is in contact with a lower thermal conductivity external portion 164 such as molybdenum or a refractory ceramic such as alumina. A bottom plate 166 which is typically formed from copper or a copper alloy and may be water cooled by means of passageway 146, isothermally removes heat from both the high thermal conductivity portion 162 and low thermal conductivity portion 164 of the substrate 160.

Figure 15:
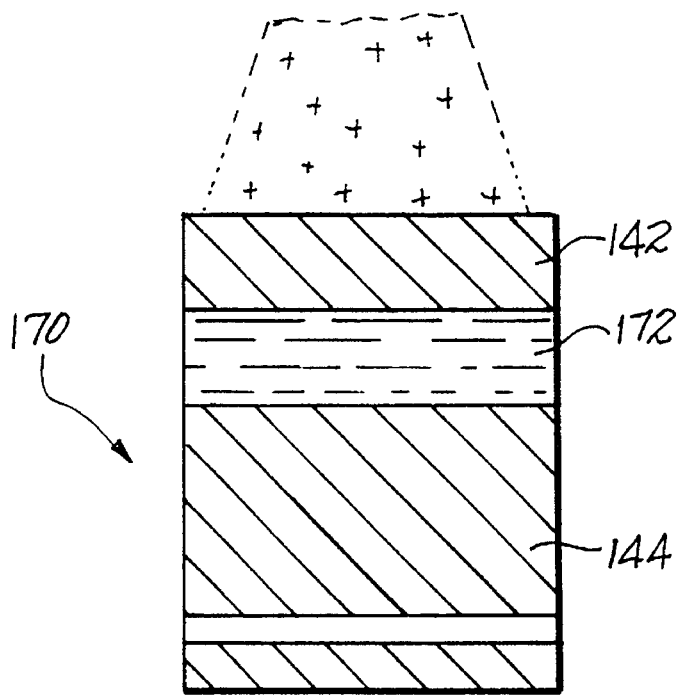

As illustrated in cross-sectional representation in FIG. 15, the substrate holder 170 may include a heat pipe 172 disposed between the top plate 142 and heat sink 144. Any suitable heat pipe as known in the art may be utilized. One preferred type of heat pipe is a stainless steel with tube filled liquid with sodium, liquid lithium or a mixture thereof. Vaporization of the sodium and/or lithium from the liquid phase to the gas phase removes heat from the top plate 142. External to the top plate 142, the vapor condenses back to the liquid phase with the release of the stored heat. A high thermal capacity heat pipe ensures a minimal temperature gradient across the top plate 142.

While the plasma generator, containment structure and substrate have been described separately and in several different embodiments, it is within the scope of the invention to combine the various components either with other components or with prior art embodiments.

The patents cited herein are intended to be incorporated in their entirety by reference.

It is apparent that there has been provided in accordance with this invention an apparatus for the deposition of a diamond film which fully satisfies the objects, means and advantages set forth hereinbefore. While the invention has been described in combination with specific embodiments and examples thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A system for the deposition of a diamond film, comprising:

a) a hydrogen source gas;

b) a plasma generator for converting said hydrogen source gas to a plasma stream, said plasma generator including a cathode and an anode;

c) a plate abutting the downstream side of said anode having a plurality of first apertures of a first diameter and a plurality of second apertures of a second, lesser diameter interspersed between said first apertures, said first apertures diverging said plasma stream to a plurality of plasma streams;

d) a feed tube for introducing a hydrocarbon feed gas to said plasma stream; and e) a substrate disposed at a point where said plurality of plasma streams overlap to receive said diamond film.

2. (amended) The system of claim 1, wherein said plasma stream passes through said first apertures.

3. The system of claim 2 wherein the distance between said plate and said substrate is from about 10 to about 200 times the average distance between first apertures.

4. The system of claim 3 wherein said distance between said plate and said substrate is from about 20 to about 100 times the average distance between first apertures.

5. The system of claim 3 wherein said second apertures deliver said hydrocarbon feed gas to said plurality of plasma streams.

6. The system of claim 5 wherein said anode contains a passageway for delivering said hydrocarbon source gas to said plasma generator.

7. The system of claim 5 wherein said plurality of plasma streams are shaped downstream of said plate either electromagnetically or by a mechanical containment structure.

8. The system of claim 7 wherein said plurality of plasma streams are contained by a mechanical containment structure.

9. The system of claim 6 wherein said substrate moves within said plurality of plasma streams.

10. The system of claim 6 wherein said substrate is mounted on a heat sink providing nonuniform thermal conductivity whereby the thermal gradient across the surface of said substrate is less than about 8° C. per centimeter.

11. A system for the deposition of a diamond film, comprising:
   a) a hydrogen source gas;
   b) a plasma generator for converting said hydrogen source gas to a plurality of plasma streams, said plasma generator including a plurality of cathodes disposed within a plurality of first apertures formed in an anode;
   c) a hydrocarbon feed gas delivered to said plasma streams through a plurality of second apertures formed in said anode and interspersed between said first apertures; and
   d) a substrate disposed at a point wherein said plurality of plasma streams overlap to receive said diamond film.

12. The system of claim 11 wherein the distance between said plasma generator and said substrate is from about 10 to about 200 times the average distance between said first apertures.

13. The system of claim 12 wherein the distance between said plasma generator and said substrate is from about 20 to about 125 times the average distance between said first apertures.

14. The system of claim 12 wherein said second apertures have an average diameter less than that of said first apertures.

15. The system of claim 12 wherein said anode is tungsten and said cathode is thoriated tungsten.

16. The system of claim 12 wherein said anode contains a passageway for delivering said hydrogen source gas to said plasma generator.

17. The system of claim 12 wherein said plurality of plasma streams are shaped either electromagnetically or by a mechanical containment structure.

18. The system of claim 17 wherein said plurality of plasma streams are contained by a mechanical containment structure.

19. The system of claim 12 wherein said substrate moves within said plurality of plasma streams.

20. The system of claim 12 wherein a heat sink supports said substrate, said heat sink having nonuniform thermal conductivity whereby the thermal gradient across the surface of said substrate is less than about 8° C./centimeter.

21. A system for the deposition of a diamond film, comprising:
   (a) a hydrogen source gas;
   (b) a plasma generator for converting said hydrogen source gas to a plasma stream, said plasma generator containing a cathode and an anode;
   (c) a feed tube for introducing a hydrocarbon feed gas to said plasma stream;
   (d) a tubular containment structure that includes turbulence inducing structures selected from the group consisting of ridges and spirals interacting with said plasma stream; and
   (e) a substrate disposed within said plasma stream to receive said diamond film.

22. The system of claim 21 wherein said containment structure has a substantially consistent diameter.

23. The system of claim 21 wherein said containment structure is rotatable.

24. The system of claim 21 wherein said containment structure is a combination of a diverging cone and a converging cone.

* * * * *

UNITED STATES PATENT AND TRADEMARK OFFICE
CERTIFICATE OF CORRECTION

PATENT NO. : 5,560,779
DATED : October 1, 1996
INVENTOR(S) : Steven C. Knowles, et al It is certified that error appears in the above-indentified patent and that said Letters Patent is hereby corrected as shown below:

On the title page, item [75], "David O. King" should read --David Q. King--.

Signed and Sealed this

Twenty-fourth Day of December, 1996

Attest:

BRUCE LEHMAN

*Attesting Officer*      *Commissioner of Patents and Trademarks*